US012672274B2

(12) United States Patent
Matsubayashi

(10) Patent No.: US 12,672,274 B2
(45) Date of Patent: Jun. 30, 2026

(54) OXIDE SEMICONDUCTOR DEVICE AND OXIDE SEMICONDUCTOR MEMORY DEVICE

(71) Applicant: Kioxia Corporation, Tokyo (JP)

(72) Inventor: Daisuke Matsubayashi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 580 days.

(21) Appl. No.: 18/161,463

(22) Filed: Jan. 30, 2023

(65) Prior Publication Data

US 2023/0413510 A1 Dec. 21, 2023

(30) Foreign Application Priority Data

Jun. 21, 2022 (JP) ................................. 2022-099938

(51) Int. Cl.
*H10B 12/00* (2023.01)
(52) U.S. Cl.
CPC ............. *H10B 12/20* (2023.02); *H10B 12/30* (2023.02)
(58) Field of Classification Search
CPC ........ H10B 12/20; H10B 12/30; H10B 12/33; H10B 12/05; H10D 30/6728; H10D 30/6755; H10D 62/102; H10D 62/124; H10D 30/60; H10D 62/235
USPC ....................................................... 257/295
See application file for complete search history.

(56) References Cited

U.S. PATENT DOCUMENTS 9,705,001 B2 7/2017 Yamazaki
10,158,026 B2 12/2018 Yamazaki et al.
10,263,015 B2 4/2019 Sasaki
10,297,322 B2 5/2019 Yamazaki et al.
2005/0001262 A1* 1/2005 Iwase ..................... G11C 16/08
257/E21.21
2008/0230838 A1* 9/2008 Ohara .................... H10B 12/00
257/350
2015/0076495 A1* 3/2015 Miyairi .................. H10D 99/00
257/43

(Continued)

FOREIGN PATENT DOCUMENTS

JP 2014-229713 12/2014
JP 2019-009259 1/2019

(Continued)

OTHER PUBLICATIONS

Internet Literature, "Layout No. 1, Layout Master, MOS_1, Fig. 1," https://layoutno1.blogspot.com/2014/12/mos1.html, Dec. 30, 2014 (3 pages).

(Continued)

*Primary Examiner* — Duy T Nguyen
(74) *Attorney, Agent, or Firm* — Foley & Lardner LLP

(57) ABSTRACT

A semiconductor device of embodiments includes: an oxide semiconductor layer including a first region, a second region, and a third region between the first region and the second region; a gate electrode facing the third region; a gate insulating layer provided between the third region and the gate electrode; a first electrode electrically connected to the first region; a second electrode electrically connected to the second region; and a p-type semiconductor layer in contact with the third region and separated from the gate electrode, the first electrode, and the second electrode, the third region being provided between the p-type semiconductor layer and the gate electrode.

13 Claims, 14 Drawing Sheets

(56) References Cited

U.S. PATENT DOCUMENTS

| | | | | |
|---|---|---|---|---|
| 2016/0111545 A1* | 4/2016 | Tanaka | .................. | H10D 64/62 |
| | | | | 257/43 |
| 2016/0336454 A1* | 11/2016 | Endo | ...................... | H10D 88/00 |
| 2016/0343866 A1* | 11/2016 | Koezuka | .............. | H10D 30/673 |
| 2021/0005758 A1* | 1/2021 | Kato | ................... | H10D 62/812 |
| 2022/0085182 A1* | 3/2022 | Kataoka | .............. | H10D 64/517 |

FOREIGN PATENT DOCUMENTS

| | | |
|---|---|---|
| TW | 202213720 A | 4/2022 |
| WO | WO-2019/107411 | 6/2019 |

OTHER PUBLICATIONS

Yoyo Hinuma, et al., "Band alignment of semiconductors fromdensity-functional theory and many-bodyperturbation theory" Physical Review B 90, 155405 (2014), 16 pages.

Internet Literature, Screenshot of Home page of Slideserve, "Basic Structure (n-channel Enhanced MOSFET): The main difference between the structure of depletion and enhanced MOSFETs—the lack of channels between the drain and source terminals (between n-type doped regions)"—https://www.slideserve.com/duscha/n-mosfet-mosfets-n-sio2-powerpoint-ppt-presentation—Apr. 4, 2019 (2 pages).

* cited by examiner p-TYPE SEMICONDUCTOR LAYER    OXIDE SEMICONDUCTOR LAYER

Ec2 > Ec1 > Ev2 > Ev1

OXIDE SEMICONDUCTOR DEVICE AND OXIDE SEMICONDUCTOR MEMORY DEVICE

CROSS-REFERENCE TO RELATED APPLICATION

This application is based upon and claims the benefit of priority from Japanese Patent Application No. 2022-099938, filed on Jun. 21, 2022, the entire contents of which are incorporated herein by reference.

FIELD

Embodiments described herein relate generally to a semiconductor device and a semiconductor memory device.

BACKGROUND

An oxide semiconductor transistor in which a channel is formed in an oxide semiconductor layer has an excellent characteristic that the channel leakage current during off operation is very small. For this reason, for example, the oxide semiconductor transistor can be applied as a switching transistor of a memory cell of a dynamic random access memory (DRAM).

DETAILED DESCRIPTION

Figure 1:
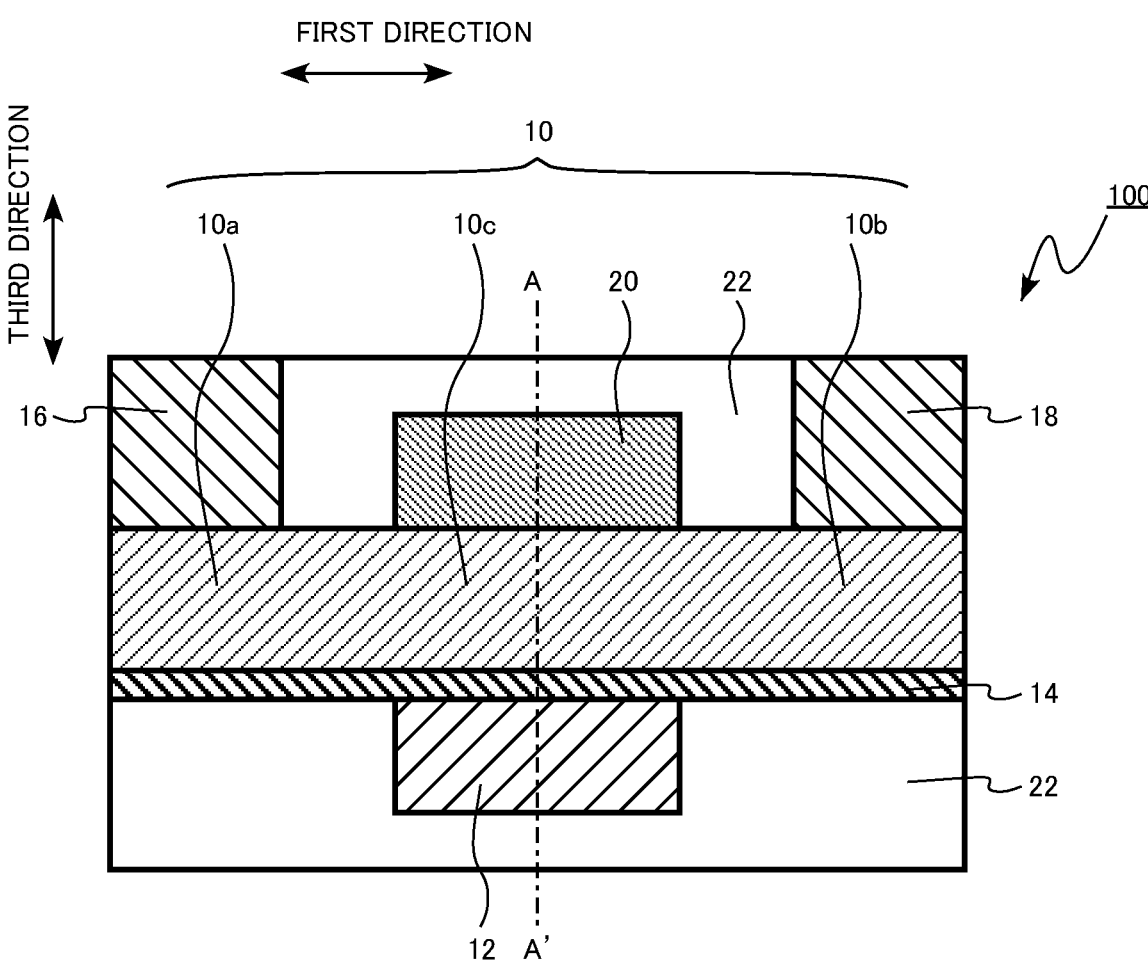
FIG. 1 is a schematic cross-sectional view of a semiconductor device according to a first embodiment.

A semiconductor device of embodiments includes: an oxide semiconductor layer including a first region, a second region, and a third region provided between the first region and the second region; a gate electrode facing the third region; a gate insulating layer provided between the third region and the gate electrode; a first electrode electrically connected to the first region; a second electrode electrically connected to the second region; and a p-type semiconductor layer in contact with the third region and separated from the gate electrode, the first electrode, and the second electrode, the third region provided between the p-type semiconductor layer and the gate electrode.

Hereinafter, embodiments will be described with reference to the diagrams. In addition, in the following description, the same or similar members and the like are denoted by the same reference numerals, and the description of the members and the like once described may be omitted as appropriate.

In addition, in this specification, the term "upper" or "lower" may be used for convenience. "Upper" or "lower" is a term indicating the relative positional relationship in the diagram, but is not a term that defines the positional relationship with respect to gravity.

The qualitative analysis and quantitative analysis of the chemical composition of members configuring the semiconductor device and the semiconductor memory device in this specification can be performed by, for example, secondary ion mass spectrometry (SIMS), energy dispersive X-ray spectroscopy (EDX), and Rutherford back-scattering spectroscopy (RBS). In addition, when measuring the thickness of each member forming the semiconductor device and the semiconductor memory device, a distance between members, a crystal particle size, and the like, it is possible to use, for example, a transmission electron microscope (TEM).

First Embodiment

A semiconductor device according to a first embodiment includes: an oxide semiconductor layer including a first region, a second region, and a third region provided between the first region and the second region; a gate electrode facing the third region; a gate insulating layer provided between the third region and the gate electrode; a first electrode electrically connected to the first region; a second electrode electrically connected to the second region; and a p-type semiconductor layer in contact with the third region and separated from the gate electrode, the first electrode, and the second electrode, the third region provided between the p-type semiconductor layer and the gate electrode.

Figure 2:
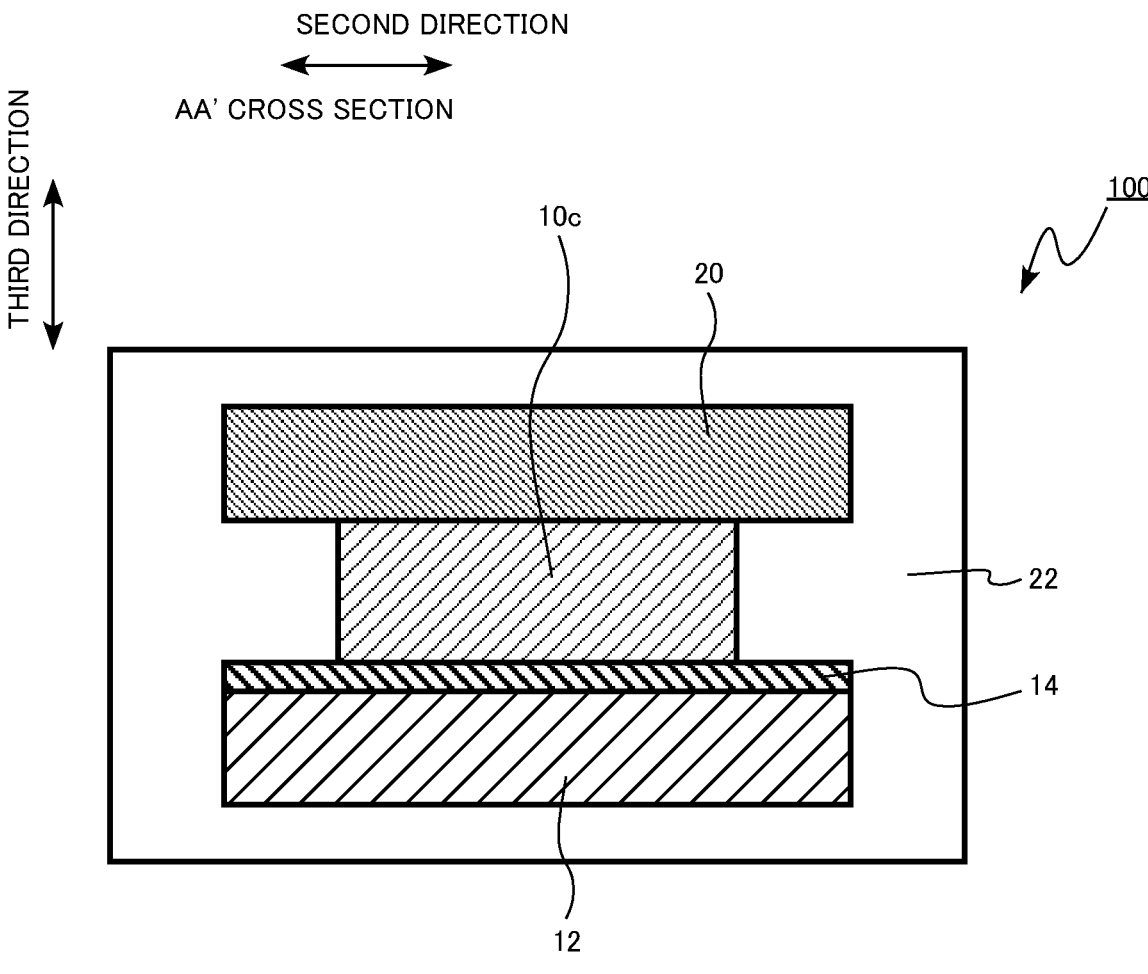
FIG. 2 is a schematic cross-sectional view of the semiconductor device according to the first embodiment.

FIGS. 1 and 2 are schematic cross-sectional views of the semiconductor device according to the first embodiment. FIG. 2 is a cross-sectional view taken along the line AA' of FIG. 1.

The semiconductor device according to the first embodiment is a transistor 100. The transistor 100 is an oxide semiconductor transistor in which a channel is formed in an oxide semiconductor layer. The transistor 100 is a so-called bottom gate type transistor in which a gate electrode is provided below an oxide semiconductor layer in which a channel is formed and a source electrode and a drain electrode are provided above the oxide semiconductor layer. The transistor 100 is an n-channel transistor having electrons as carriers.

The transistor 100 includes an oxide semiconductor layer 10, a gate electrode 12, a gate insulating layer 14, a source electrode 16, a drain electrode 18, a p-type semiconductor layer 20, and an interlayer insulating layer 22. The oxide semiconductor layer 10 includes a first region 10a, a second region 10b, and a third region 10c.

The source electrode 16 is an example of the first electrode. The drain electrode 18 is an example of the second electrode.

A direction connecting the source electrode 16 and the drain electrode 18 to each other is defined as a first direction. The first direction is parallel to the interface between the oxide semiconductor layer 10 and the p-type semiconductor layer 20. A direction perpendicular to the first direction and parallel to the interface between the oxide semiconductor layer 10 and the p-type semiconductor layer 20 is defined as a second direction. A direction perpendicular to the first direction and the second direction is defined as a third direction. The third direction is a direction connecting the gate electrode 12 and the p-type semiconductor layer 20 to each other.

The oxide semiconductor layer 10 includes the first region 10a, the second region 10b, and the third region 10c. The third region 10c is provided between the first region 10a and the second region 10b. The third region 10c is interposed between the first region 10a and the second region 10b.

The oxide semiconductor layer 10 is an oxide semiconductor. The oxide semiconductor layer 10 is amorphous, for example.

The oxide semiconductor layer 10 contains, for example, zinc (Zn), oxygen (O), and at least one element selected from a group consisting of indium (In), gallium (Ga), silicon (Si), aluminum (Al), and tin (Sn).

The oxide semiconductor layer 10 contains, for example, indium (In), gallium (Ga), and zinc (Zn). The oxide semiconductor layer 10 contains, for example, indium gallium zinc oxide. The oxide semiconductor layer 10 is, for example, an indium gallium zinc oxide layer.

The oxide semiconductor layer 10 contains, for example, indium (In), aluminum (Al), and zinc (Zn). The oxide semiconductor layer 10 contains, for example, indium aluminum zinc oxide. The oxide semiconductor layer 10 is, for example, an indium aluminum zinc oxide layer.

The oxide semiconductor layer 10 is, for example, n-type. The oxide semiconductor layer 10 is, for example, an n-type semiconductor. The oxide semiconductor layer 10 contains, for example, oxygen vacancies. The oxygen vacancy in the oxide semiconductor layer 10 functions as a donor.

The thickness of the oxide semiconductor layer 10 in the third direction is, for example, equal to or more than 10 nm and equal to or less than 100 nm.

The gate electrode 12 faces the third region 10c of the oxide semiconductor layer 10. The gate electrode 12 is provided below the oxide semiconductor layer 10. The gate electrode 12 is, for example, a metal, a metal compound, or a semiconductor. The gate electrode 12 is, for example, titanium nitride (TiN) or tungsten (W).

As shown in FIG. 2, the width of the gate electrode 12 in the second direction is larger than the width of the oxide semiconductor layer 10 in the second direction, for example.

The gate insulating layer 14 is provided between the third region 10c of the oxide semiconductor layer 10 and the gate electrode 12. The gate insulating layer 14 is in contact with the third region 10c and the gate electrode 12, for example.

The gate insulating layer 14 is, for example, an oxide or an oxynitride. The gate insulating layer 14 is, for example, a silicon oxide or an aluminum oxide. The thickness of the gate insulating layer 14 in the third direction is, for example, equal to or more than 2 nm and equal to or less than 10 nm.

The source electrode 16 is provided on the first region 10a of the oxide semiconductor layer 10. The source electrode 16 is electrically connected to the first region 10a. The source electrode 16 is in contact with, for example, the first region 10a.

The source electrode 16 is, for example, a metal or a metal compound. The source electrode 16 is, for example, titanium, titanium nitride, tungsten, tungsten nitride, copper, aluminum, tantalum, tantalum nitride, or molybdenum.

The drain electrode 18 is provided on the second region 10b of the oxide semiconductor layer 10. The drain electrode 18 is electrically connected to the second region 10b. The drain electrode 18 is in contact with, for example, the second region 10b.

The drain electrode 18 is, for example, a metal or a metal compound. The drain electrode 18 is, for example, titanium, titanium nitride, tungsten, tungsten nitride, copper, aluminum, tantalum, tantalum nitride, or molybdenum.

The p-type semiconductor layer 20 faces the third region 10c of the oxide semiconductor layer 10. The p-type semiconductor layer 20 is provided on the third region 10c of the oxide semiconductor layer 10. The p-type semiconductor layer 20 is in contact with the third region 10c. The third region 10c is provided between the gate electrode 12 and the p-type semiconductor layer 20.

The p-type semiconductor layer 20 is separated from the gate electrode 12, the source electrode 16 and the drain electrode 18. The p-type semiconductor layer 20 is separated from all electrodes including the gate electrode 12, the source electrode 16, and the drain electrode 18. The p-type semiconductor layer 20 is electrically floating.

As shown in FIG. 2, the width of the p-type semiconductor layer 20 in the second direction is larger than, for example, the width of the oxide semiconductor layer 10 in the second direction.

Figure 3:
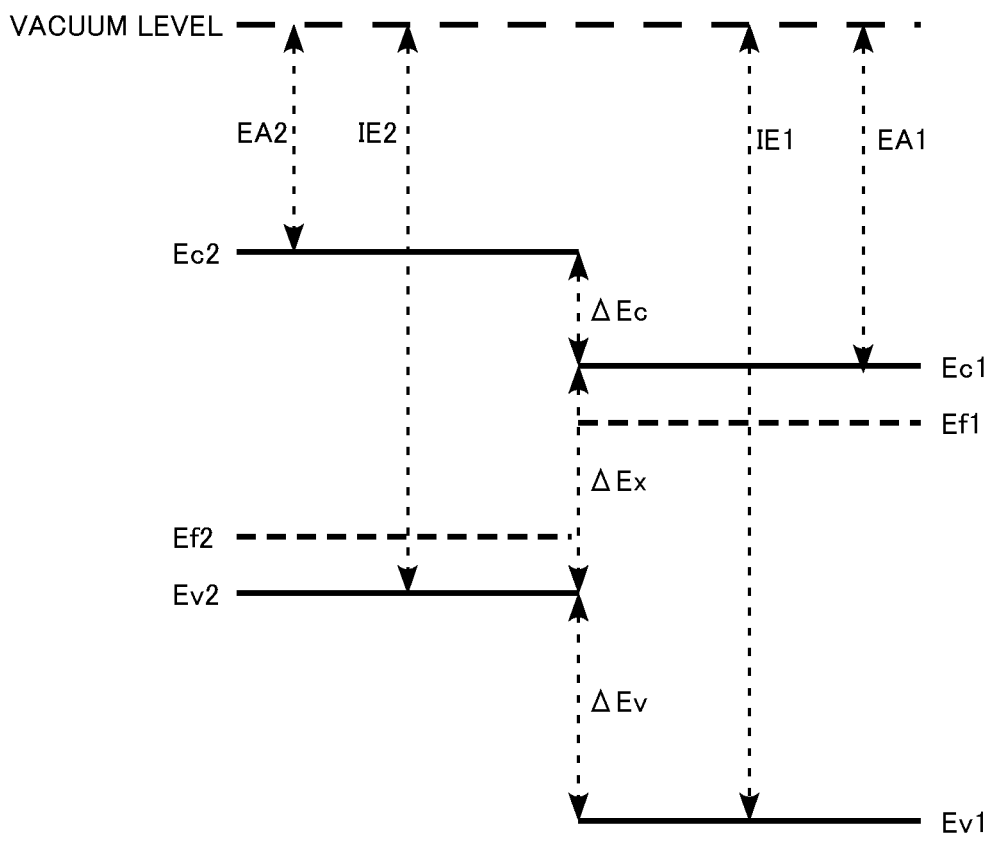
FIG. 3 is a diagram showing the energy level relationship of the semiconductor device according to the first embodiment.

FIG. 3 is a diagram showing the energy level relationship of the semiconductor device according to the first embodiment. FIG. 3 is a diagram showing the energy level relationship (band alignment) between the p-type semiconductor layer 20 and the oxide semiconductor layer 10 of the transistor 100.

FIG. 3 shows the conduction band bottom energy (Ec2 in FIG. 3) of the p-type semiconductor layer 20, the valence band top energy (Ev2 in FIG. 3) of the p-type semiconductor layer 20, and the Fermi level (Ef2 in FIG. 3) of the p-type semiconductor layer 20. In addition, FIG. 3 shows the conduction band bottom energy (Ec1 in FIG. 3) of the oxide semiconductor layer 10, the valence band top energy (Ev1 in FIG. 3) of the oxide semiconductor layer 10, and the Fermi level (Ef1 in FIG. 3) of the oxide semiconductor layer 10.

The conduction band bottom energy Ec2 of the p-type semiconductor layer 20 is larger than the conduction band bottom energy Ec1 of the oxide semiconductor layer 10, for example. In addition, the conduction band bottom energy Ec1 of the oxide semiconductor layer 10 is larger than the valence band top energy Ev2 of the p-type semiconductor layer 20, for example. In addition, the valence band top energy Ev2 of the p-type semiconductor layer 20 is larger than the valence band top energy Ev1 of the oxide semiconductor layer 10.

In other words, the electron affinity (EA2 in FIG. 3) of the p-type semiconductor layer 20 is smaller than the electron affinity (EA1 in FIG. 3) of the oxide semiconductor layer 10, for example. In addition, the electron affinity EA1 of the oxide semiconductor layer 10 is smaller than the ionization energy (IE2 in FIG. 3) of the p-type semiconductor layer 20, for example. In addition, the ionization energy IE2 of the p-type semiconductor layer 20 is smaller than the ionization energy (IE1 in FIG. 3) of the oxide semiconductor layer 10, for example.

The difference ($\Delta$Ec in FIG. 3) between the conduction band bottom energy Ec2 of the p-type semiconductor layer 20 and the conduction band bottom energy Ec1 of the oxide semiconductor layer 10 is, for example, equal to or more than 0.25 eV. In addition, the difference ($\Delta$Ex in FIG. 3) between the conduction band bottom energy Ec1 of the oxide semiconductor layer 10 and the valence band top energy Ev2 of the p-type semiconductor layer 20 is, for example, equal to or more than 0.25 eV. In addition, the difference ($\Delta$Ev in FIG. 3) between the valence band top energy Ev2 of the p-type semiconductor layer 20 and the valence band top energy Ev1 of the oxide semiconductor layer 10 is, for example, equal to or more than 0.25 eV.

The p-type semiconductor layer 20 is p-type. The p-type semiconductor layer 20 is a p-type semiconductor.

The p-type semiconductor layer 20 contains, for example, silicon (Si) or germanium (Ge). The p-type semiconductor layer 20 is, for example, a silicon layer, a germanium layer, or a silicon germanide layer.

The p-type semiconductor layer 20 contains, for example, a compound semiconductor. The p-type semiconductor layer 20 contains, for example, aluminum phosphide, aluminum arsenide, aluminum antimonide, gallium phosphide, gallium arsenide, zinc sulfide, zinc selenide, or gallium nitride. The p-type semiconductor layer 20 is, for example, an aluminum phosphide layer, an aluminum arsenide layer, an aluminum antimonide layer, a gallium phosphide layer, a gallium arsenide layer, a zinc sulfide layer, a zinc selenide layer, or a gallium nitride layer.

The p-type semiconductor layer 20 contains p-type impurities. When the p-type semiconductor layer 20 is a silicon layer, the p-type semiconductor layer 20 contains, for example, boron (B) as a p-type impurity.

The p-type impurity concentration in the p-type semiconductor layer 20 is, for example, equal to or more than $1 \times 10^{18}$ atoms/cm$^3$ and less than $8 \times 10^{19}$ atoms/cm$^3$.

For example, a p-type semiconductor region having a high oxygen concentration may be present near the interface between the p-type semiconductor layer 20 and the oxide semiconductor layer 10.

The interlayer insulating layer 22 is provided between the source electrode 16 and the drain electrode 18. The interlayer insulating layer 22 surrounds the oxide semiconductor layer 10, the gate electrode 12, and the p-type semiconductor layer 20.

The interlayer insulating layer 22 is an insulator. The interlayer insulating layer 22 contains, for example, silicon oxide. The interlayer insulating layer 22 is, for example, a silicon oxide layer.

Next, the function and effect of the semiconductor device according to the first embodiment will be described.

Figure 4:
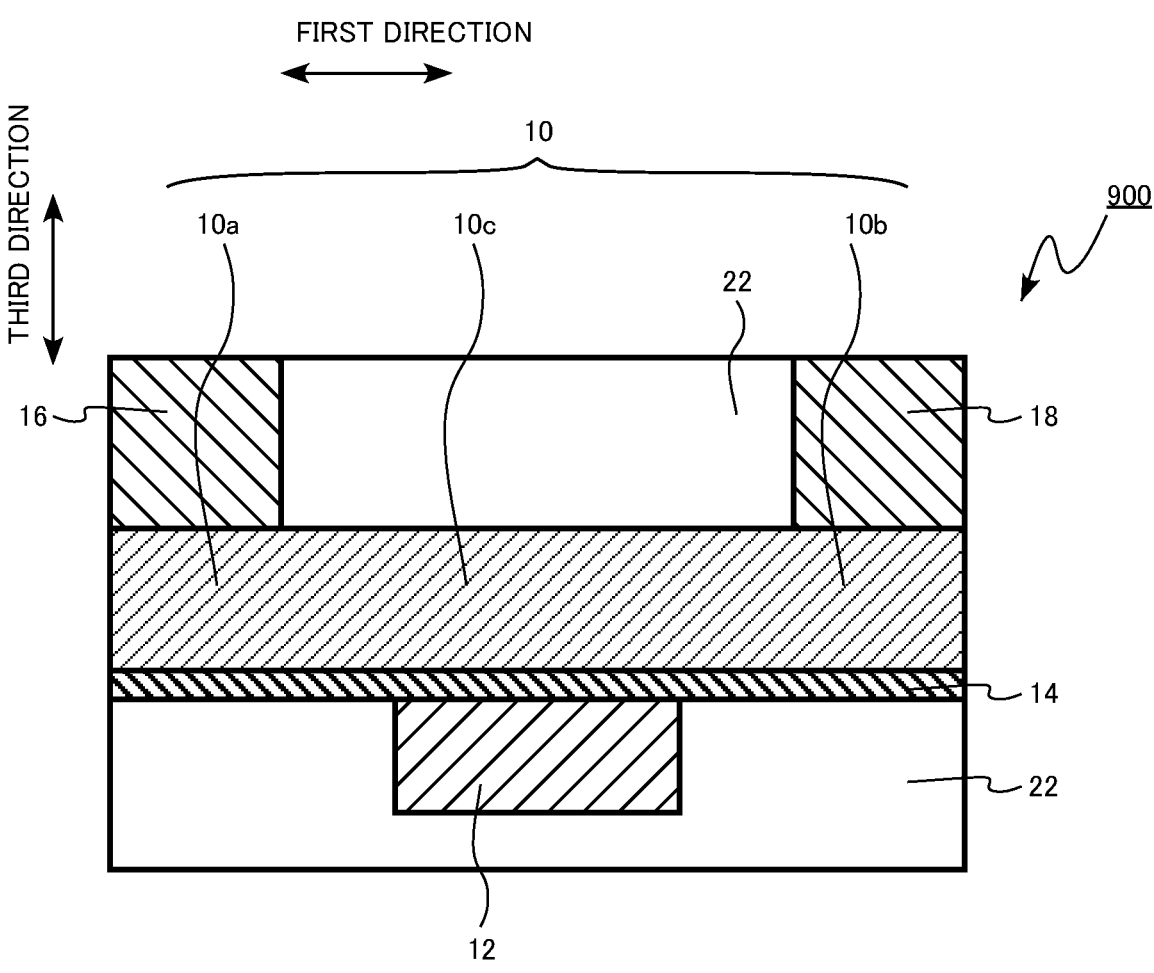
FIG. 4 is a schematic cross-sectional view of a semiconductor device of a comparative example.

FIG. 4 is a schematic cross-sectional view of a semiconductor device of a comparative example. FIG. 4 is a diagram corresponding to FIG. 1 of the first embodiment.

The semiconductor device of the comparative example is a transistor 900. The transistor 900 is an oxide semiconductor transistor in which a channel is formed in an oxide semiconductor layer. The transistor 900 is an re-channel transistor having electrons as carriers.

The transistor 900 of the comparative example is different from the transistor 100 according to the first embodiment in that the p-type semiconductor layer 20 is not provided.

When the transistor 900 of the comparative example is in the off state, a gate turn-off voltage is applied to the gate electrode 12. Due to the application of the gate turn-off voltage to the gate electrode 12, the depletion of the third region 10c of the oxide semiconductor layer 10 progresses from the side facing the gate electrode 12. Due to the depletion of the third region 10c of the oxide semiconductor layer 10, electrical conduction between the first region 10a and the second region 10b is blocked, and the transistor 900 is turned off.

For example, a case is considered in which the electron concentration in the third region 10c is increased in order to increase the on-current of the transistor 900. For example, by increasing the oxygen vacancy density in the third region 10c, the electron concentration in the third region 10c can be increased.

If the electron concentration in the third region 10c is increased, for example, the depletion of the third region 10c by the gate voltage applied to the gate electrode 12 becomes difficult. In other words, increasing the electron concentration in the third region 10c lowers the threshold voltage of the transistor 900. When the threshold voltage of the transistor 900 is lowered, for example, the cutoff characteristics of the transistor 900 are degraded, which causes a problem.

Figure 5:
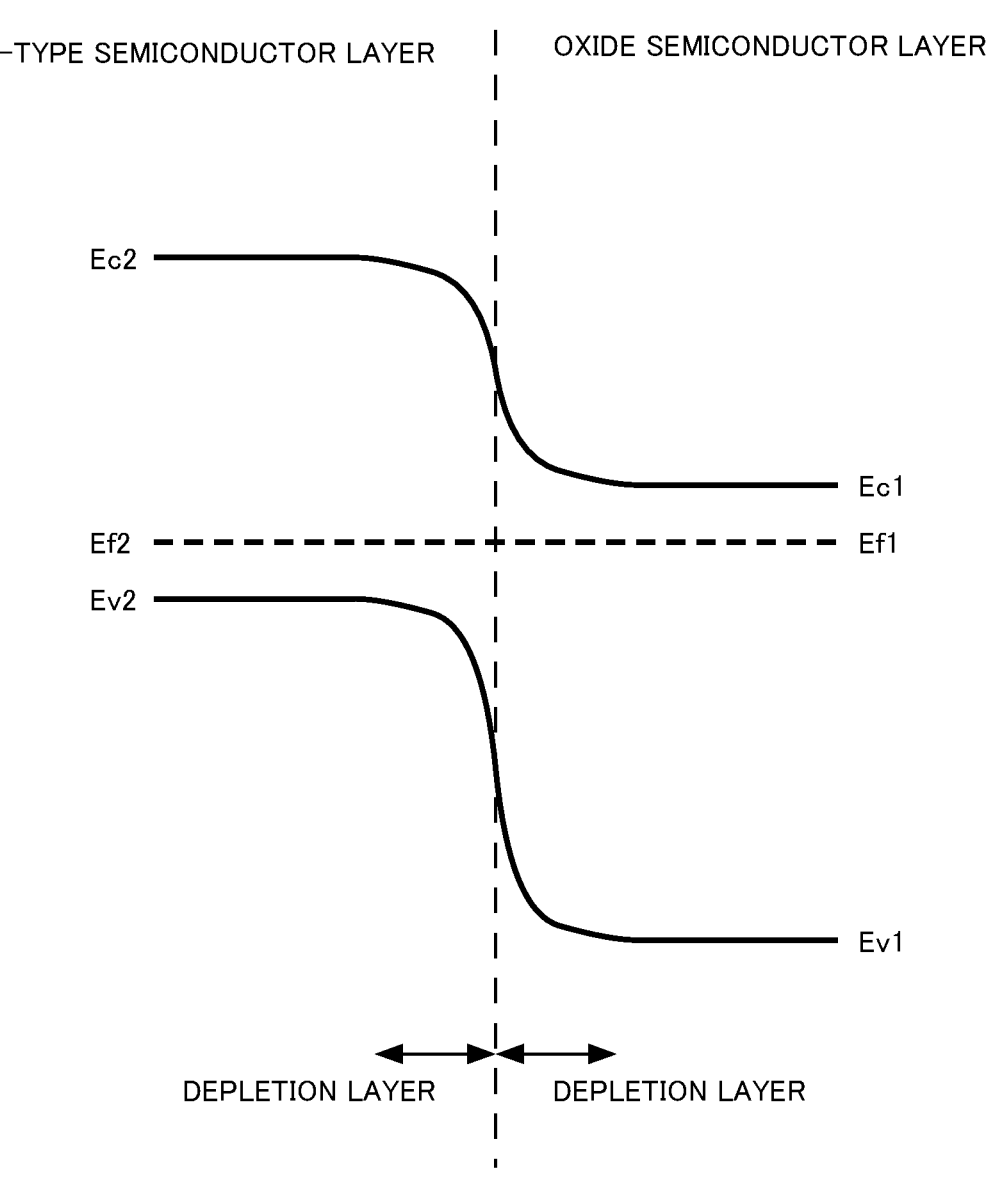
FIG. 5 is an explanatory diagram of the function and effect of the semiconductor device according to the first embodiment.

FIG. 5 is an explanatory diagram of the function and effect of the semiconductor device according to the first embodiment.

FIG. 5 is an energy band diagram when the p-type semiconductor layer 20 is in contact with the oxide semiconductor layer 10. When the p-type semiconductor layer 20 and the oxide semiconductor layer 10 are in contact with each other, carriers move between the p-type semiconductor layer 20 and the oxide semiconductor layer so that the Fermi level Ef2 of the p-type semiconductor layer 20 and the Fermi level Ef1 of the oxide semiconductor layer 10 match each other.

When the p-type semiconductor layer 20 and the oxide semiconductor layer 10 are in contact with each other, a depletion layer extends from the boundary between the p-type semiconductor layer 20 and the oxide semiconductor layer 10 toward the p-type semiconductor layer 20. Similarly, a depletion layer extends from the boundary between the p-type semiconductor layer 20 and the oxide semiconductor layer 10 toward the oxide semiconductor layer 10.

When the p-type semiconductor layer 20 and the oxide semiconductor layer 10 are in contact with each other, the depletion of the third region 10c of the oxide semiconductor layer 10 progresses from the side facing the p-type semiconductor layer 20. Therefore, when the gate turn-off voltage is applied to the gate electrode 12, the depletion of the third region 10c of the oxide semiconductor layer 10 progresses from both the directions of the side facing the gate electrode 12 and the side facing the p-type semiconductor layer 20.

Therefore, by providing the p-type semiconductor layer 20, the threshold voltage of the transistor 100 is increased. As a result, for example, even when the electron concentration in the third region 10c is increased to increase the on-current, it is possible to suppress the degradation of the cutoff characteristics of the transistor 100.

From the viewpoint of increasing the threshold voltage of the transistor 100, it is preferable that the difference ($\Delta$Ex in FIG. 3) between the conduction band bottom energy Ec1 of the oxide semiconductor layer 10 and the valence band top energy Ev2 of the p-type semiconductor layer 20 is equal to or more than 0.25 eV. Since the energy difference between the Fermi level Ef2 of the p-type semiconductor layer 20 and the Fermi level Ef1 of the oxide semiconductor layer 10 can be increased, it is possible to increase the threshold voltage of the transistor 100.

From the viewpoint of securing a barrier against electrons between the oxide semiconductor layer 10 and the p-type semiconductor layer 20, it is preferable that the difference (ΔEc in FIG. 3) between the conduction band bottom energy Ec2 of the p-type semiconductor layer 20 and the conduction band bottom energy Ec1 of the oxide semiconductor layer 10 is equal to or more than 0.25 eV.

From the viewpoint of securing a barrier against holes between the oxide semiconductor layer 10 and the p-type semiconductor layer 20, it is preferable that the difference (ΔEv in FIG. 3) between the valence band top energy Ev2 of the p-type semiconductor layer 20 and the valence band top energy Ev1 of the oxide semiconductor layer 10 is equal to or more than 0.25 eV.

From the viewpoint of increasing the threshold voltage of the transistor 100, the p-type impurity concentration in the p-type semiconductor layer 20 is preferably equal to or more than $1 \times 10^{18}$ atoms/cm$^3$, more preferably equal to or more than $5 \times 10^{18}$ atoms/cm$^3$, and even more preferably equal to or more than $1 \times 10^{19}$ atoms/cm$^3$. As the p-type impurity concentration increases, the Fermi level Ef2 of the p-type semiconductor layer 20 approaches the valence band top energy Ev2 of the p-type semiconductor layer 20. Therefore, the energy difference between the Fermi level Ef2 of the p-type semiconductor layer 20 and the Fermi level Ef1 of the oxide semiconductor layer 10 increases, and the threshold voltage of the transistor 100 increases.

From the viewpoint of suppressing a decrease in threshold voltage due to band-to-band tunneling between the oxide semiconductor layer 10 and the p-type semiconductor layer 20, it is preferable that the p-type impurity concentration in the p-type semiconductor layer 20 is less than $8 \times 10^{19}$ atoms/cm$^3$.

From the viewpoint of suppressing a decrease in threshold voltage due to parasitic channel formation, it is preferable that the width of the p-type semiconductor layer in the second direction is larger than the width of the oxide semiconductor layer 10 in the second direction.

First Modification Example

A semiconductor device of a first modification example of the first embodiment is different from the semiconductor device according to the first embodiment in that the p-type semiconductor layer is provided between the first region and the second region in the first direction connecting the first electrode and the second electrode to each other.

Figure 6:
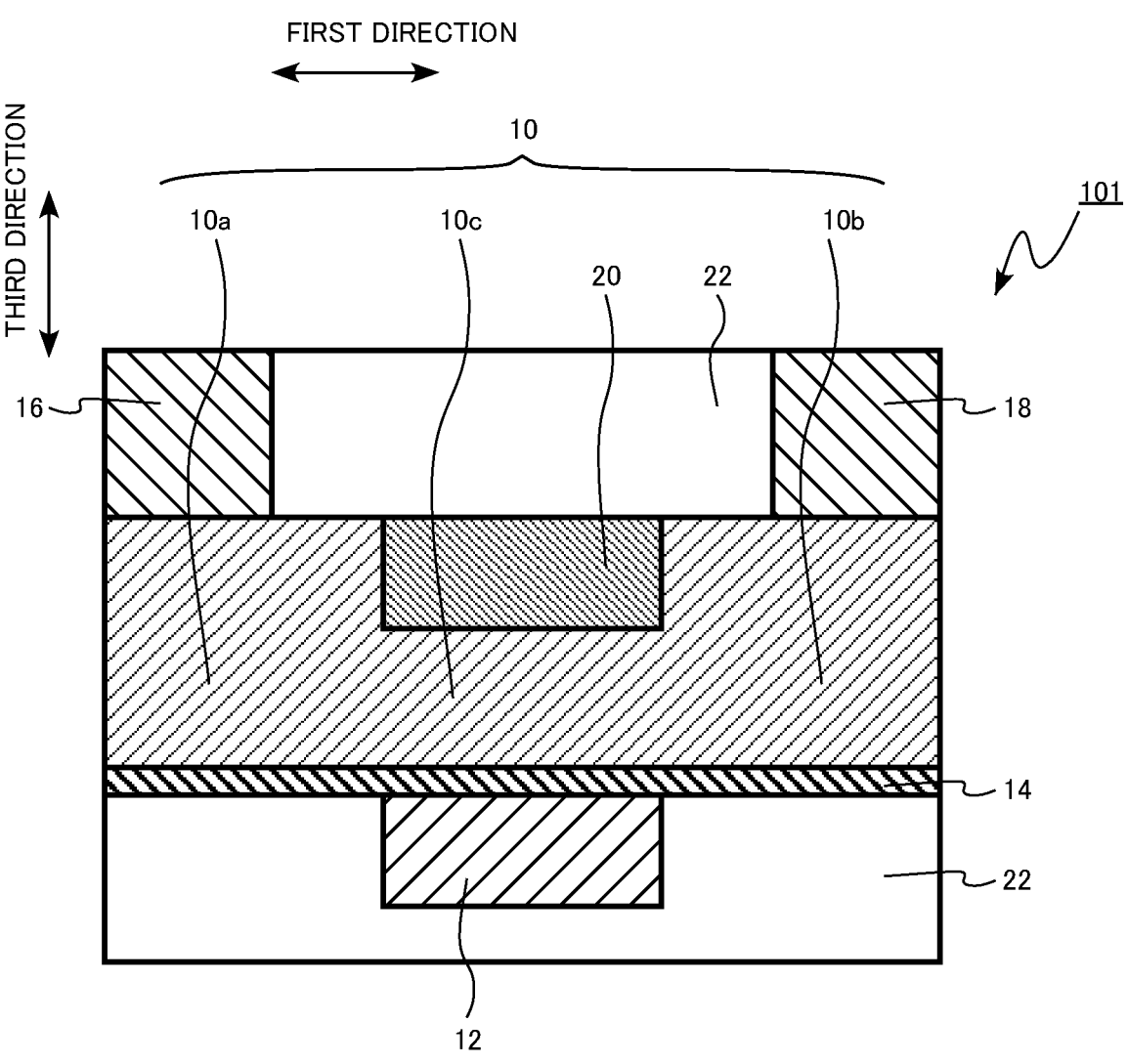
FIG. 6 is a schematic cross-sectional view of a semiconductor device of a first modification example of the first embodiment.

FIG. 6 is a schematic cross-sectional view of the semiconductor device of the first modification example of the first embodiment. FIG. 6 is a diagram corresponding to FIG. 1 of the first embodiment.

The semiconductor device of the first modification example is a transistor 101.

In the first direction connecting the source electrode 16 and the drain electrode 18 to each other, the p-type semiconductor layer 20 is provided between the first region 10a and the second region 10b. In the first direction, the p-type semiconductor layer 20 is interposed between the first region 10a and the second region 10b. The p-type semiconductor layer 20 is buried in the oxide semiconductor layer 10.

The thickness of the first region 10a in the third direction is larger than the thickness of the third region 10c in the third direction. In addition, the thickness of the second region 10b in the third direction is larger than the thickness of the third region 10c in the third direction.

In the transistor 101 of the first modification example, the parasitic resistance of the first region 10a and the parasitic resistance of the second region 10b are reduced compared to the transistor 100 according to the first embodiment. Therefore, the on-resistance is reduced and the on-current is increased compared with the transistor 100 according to the first embodiment.

Second Modification Example

A semiconductor device of a second modification example of the first embodiment is different from the semiconductor device according to the first embodiment in that the semiconductor device of the second modification example is a so-called top gate type transistor.

Figure 7:
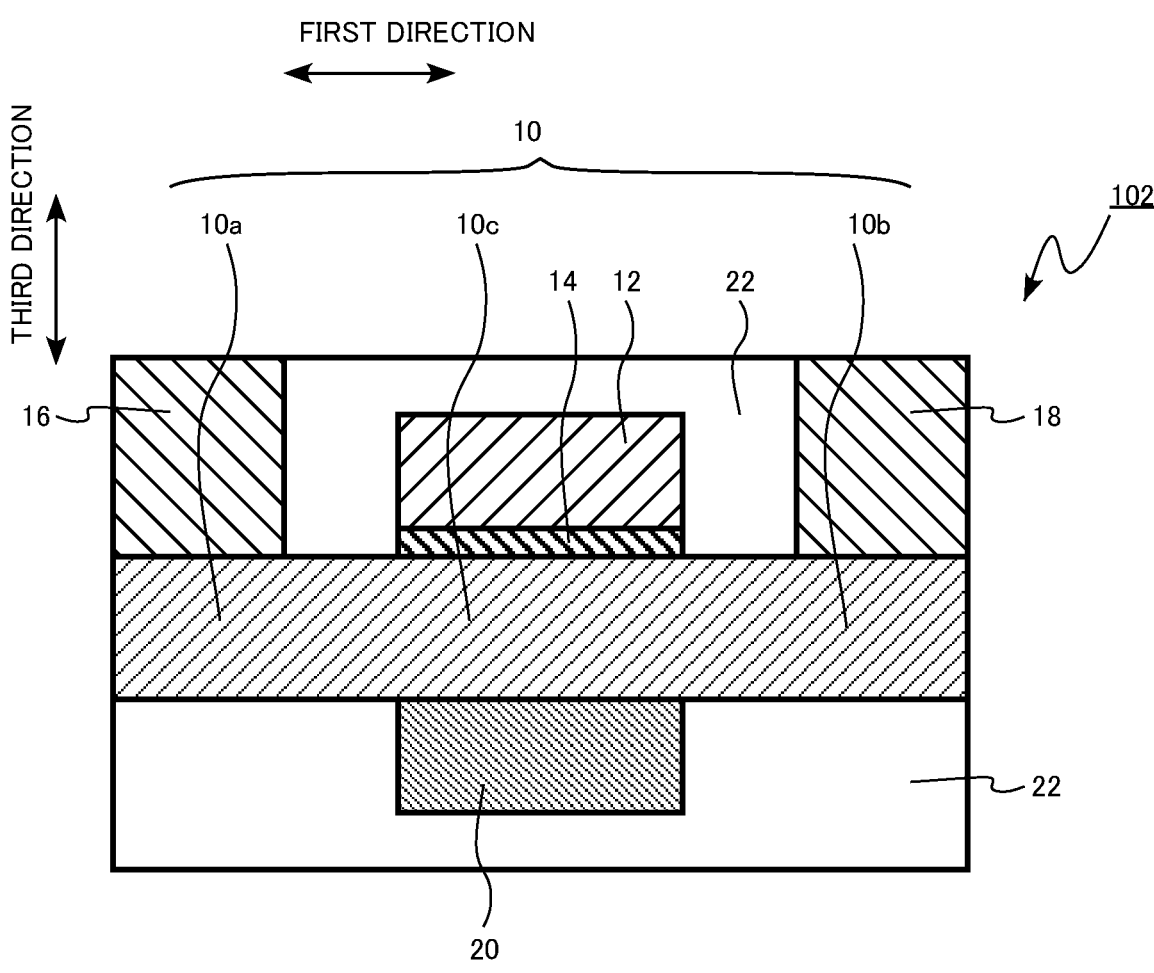
FIG. 7 is a schematic cross-sectional view of a semiconductor device of a second modification example of the first embodiment.

FIG. 7 is a schematic cross-sectional view of the semiconductor device of the second modification example of the first embodiment. FIG. 7 is a diagram corresponding to FIG. 1 of the first embodiment.

The semiconductor device of the second modification example is a transistor 102.

The transistor 102 is a so-called top gate type transistor in which the gate electrode 12, the source electrode 16, and the drain electrode 18 are provided above the oxide semiconductor layer 10 in which a channel is formed. The p-type semiconductor layer 20 is provided below the oxide semiconductor layer 10.

As described above, according to the first embodiment and its modification examples, since the threshold voltage is increased, it is possible to realize an oxide semiconductor transistor having excellent characteristics.

Second Embodiment

A semiconductor device according to a second embodiment includes: a first electrode; a second electrode; an oxide semiconductor layer provided between the first electrode and the second electrode; a gate electrode facing the oxide semiconductor layer; a gate insulating layer provided between the gate electrode and the oxide semiconductor layer; and p-type semiconductor layer surrounded by the oxide semiconductor layer, in contact with the oxide semiconductor layer, and separated from the gate electrode, the first electrode, and the second electrode. The semiconductor device according to the second embodiment is different from the semiconductor device according to the first embodiment in that the semiconductor device according to the second embodiment is a so-called vertical transistor. Hereinafter, the description of a part of the content overlapping the first embodiment may be omitted.

Figure 8:
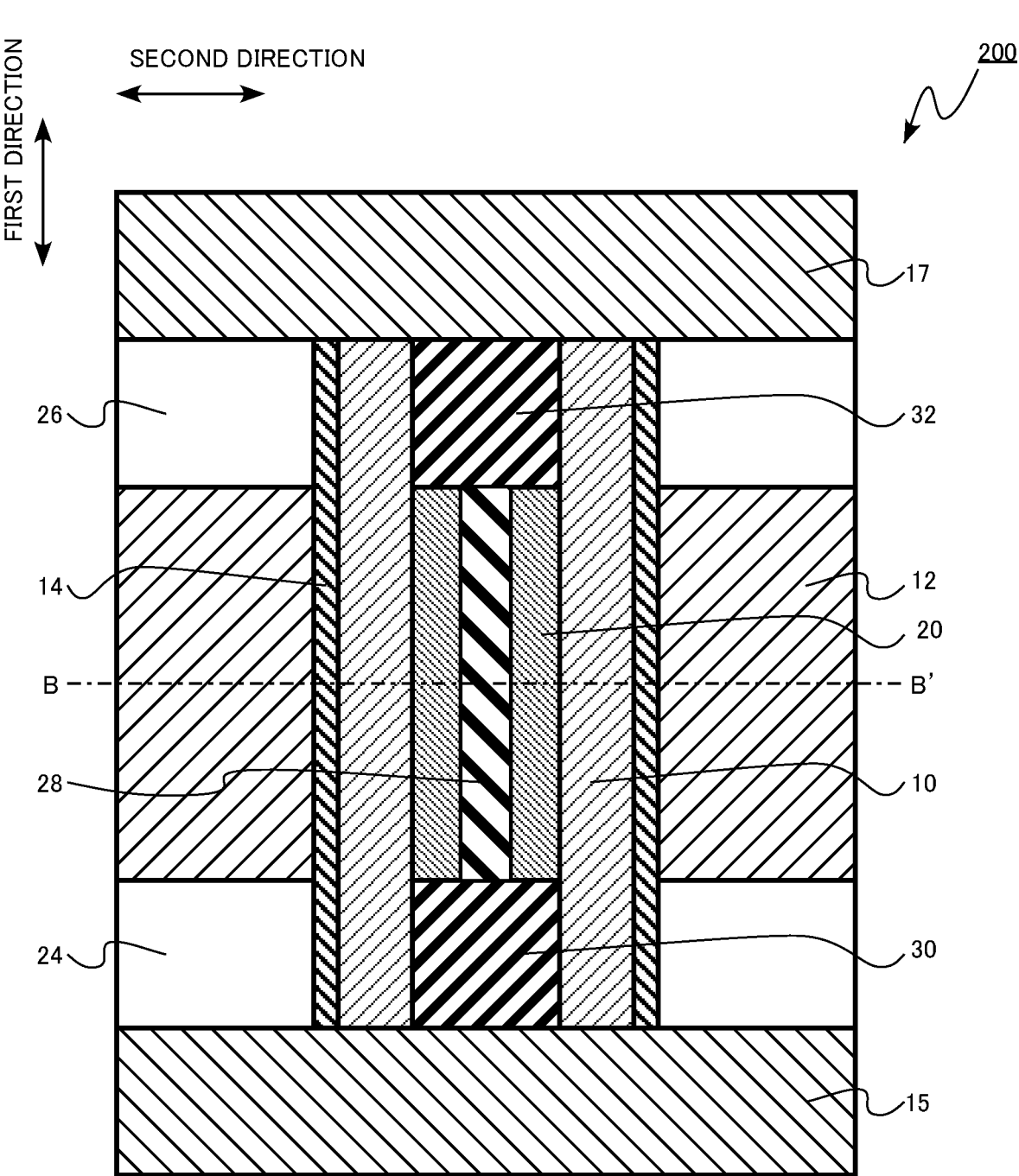
FIG. 8 is a schematic cross-sectional view of a semiconductor device according to a second embodiment.
Figure 9:
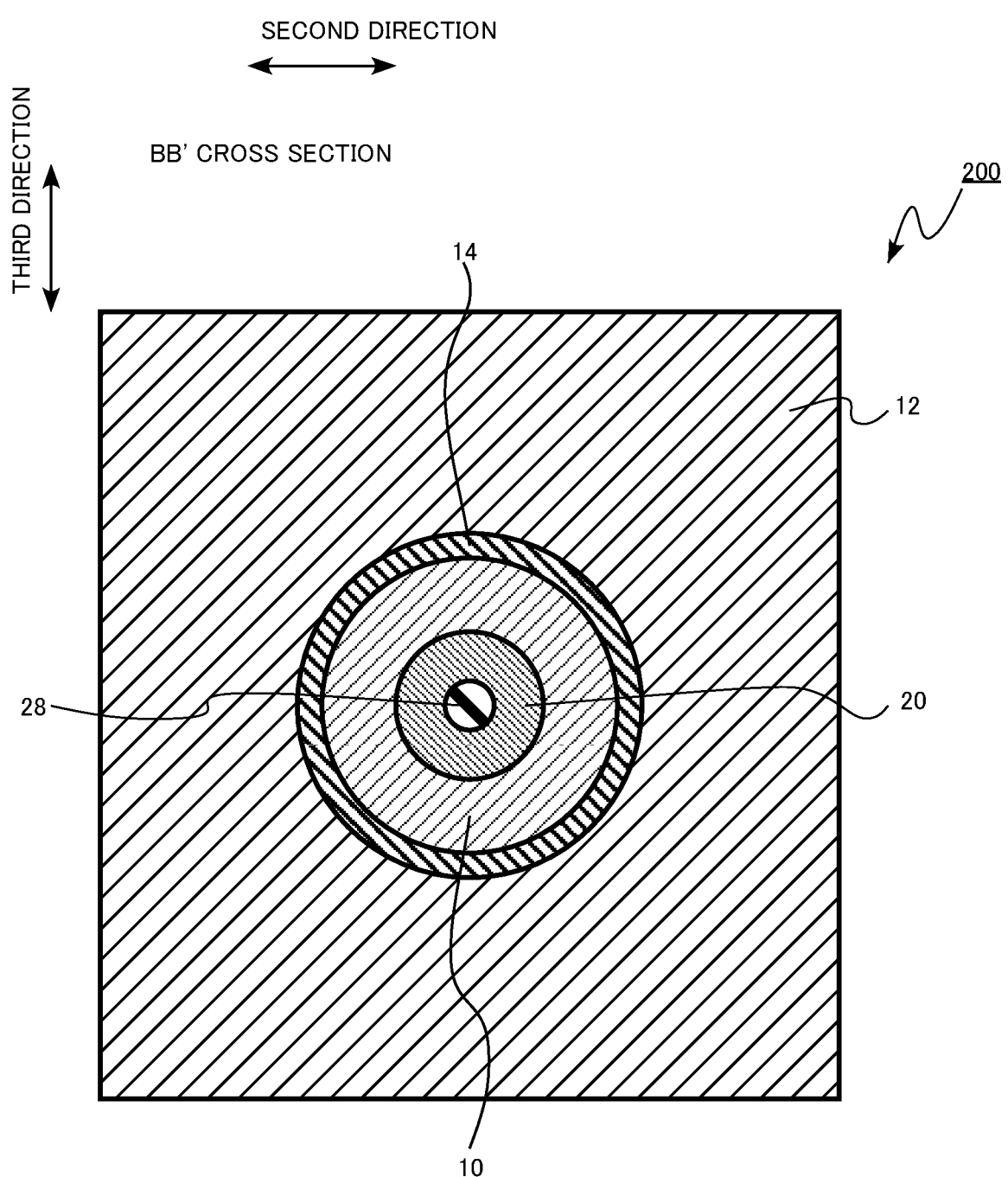
FIG. 9 is a schematic cross-sectional view of the semiconductor device according to the second embodiment.

FIGS. 8 and 9 are schematic cross-sectional views of the semiconductor device according to the second embodiment. FIG. 9 is a cross-sectional view taken along the line BB' of FIG. 8.

The semiconductor device according to the second embodiment is a transistor 200. The transistor 200 is an oxide semiconductor transistor in which a channel is formed in an oxide semiconductor. In the transistor 200, a gate electrode is provided so as to surround an oxide semiconductor layer in which a channel is formed. The transistor 200 is a so-called surrounding gate transistor (SGT). The transistor 200 is a so-called vertical transistor.

The transistor 200 includes an oxide semiconductor layer 10, a gate electrode 12, a gate insulating layer 14, a lower electrode 15, an upper electrode 17, a p-type semiconductor layer 20, a lower insulating layer 24, an upper insulating layer 26, a core insulating layer 28, a lower isolation insulating layer 30, and an upper isolation insulating layer 32.

The lower electrode 15 is an example of the first electrode. The upper electrode 17 is an example of the second electrode. The core insulating layer 28 is an example of the third insulating layer. The lower isolation insulating layer 30 is an example of the first insulating layer. The upper isolation insulating layer 32 is an example of the second insulating layer.

A direction connecting the lower electrode 15 and the upper electrode 17 to each other is defined as a first direction. A direction perpendicular to the first direction is defined as a second direction. A direction perpendicular to the first direction and the second direction is defined as a third direction.

The lower electrode 15 functions as a source electrode or a drain electrode of the transistor 200.

The lower electrode 15 is a conductor. The lower electrode 15 includes, for example, an oxide conductor or metal.

The lower electrode 15 contains, for example, an oxide conductor containing indium (In), tin (Sn), and oxygen (O). The lower electrode 15 contains, for example, indium tin oxide. The lower electrode 15 is, for example, an indium tin oxide layer.

The lower electrode 15 contains, for example, a metal or metal compound containing tungsten (W), molybdenum (Mo), copper (Cu), aluminum (Al), titanium (Ti), or tantalum (Ta).

The lower electrode 15 may have, for example, a stacked structure of a plurality of conductors.

The upper electrode 17 is provided above the lower electrode 15. The upper electrode 17 functions as a source electrode or a drain electrode of the transistor 200.

The upper electrode 17 is a conductor. The upper electrode 17 contains, for example, an oxide conductor or metal.

The upper electrode 17 contains, for example, an oxide conductor containing indium (In), tin (Sn), and oxygen (O). The upper electrode 17 contains, for example, indium tin oxide. The upper electrode 17 is, for example, an indium tin oxide layer.

The upper electrode 17 contains, for example, a metal or metal compound containing tungsten (W), molybdenum (Mo), copper (Cu), aluminum (Al), titanium (Ti), or tantalum (Ta).

The upper electrode 17 may have, for example, a stacked structure of a plurality of conductors.

The lower electrode 15 and the upper electrode 17 are formed of, for example, the same material. For example, the lower electrode 15 and the upper electrode 17 are oxide conductors containing indium (In), tin (Sn), and oxygen (O). The lower electrode 15 and the upper electrode 17 contain, for example, indium tin oxide. The lower electrode 15 and the upper electrode 17 are, for example, indium tin oxide layers.

The oxide semiconductor layer 10 is provided between the lower electrode 15 and the upper electrode 17. The oxide semiconductor layer 10 is in contact with the lower electrode 15, for example. The oxide semiconductor layer 10 is in contact with the upper electrode 17, for example.

In the oxide semiconductor layer 10, a channel serving as a current path is formed when the transistor 200 is turned on.

The oxide semiconductor layer 10 is an oxide semiconductor. The oxide semiconductor layer 10 is amorphous, for example.

The oxide semiconductor layer 10 contains, for example, zinc (Zn), oxygen (O), and at least one element selected from a group consisting of indium (In), gallium (Ga), silicon (Si), aluminum (Al), and tin (Sn).

The oxide semiconductor layer 10 contains, for example, indium (In), gallium (Ga), and zinc (Zn). The oxide semiconductor layer 10 contains, for example, indium gallium zinc oxide. The oxide semiconductor layer 10 is, for example, an indium gallium zinc oxide layer.

The oxide semiconductor layer 10 contains, for example, indium (In), aluminum (Al), and zinc (Zn). The oxide semiconductor layer 10 contains, for example, indium aluminum zinc oxide. The oxide semiconductor layer 10 is, for example, an indium aluminum zinc oxide layer.

The oxide semiconductor layer 10 is, for example, n-type. The oxide semiconductor layer 10 is, for example, an n-type semiconductor. The oxide semiconductor layer 10 contains, for example, oxygen vacancies. The oxygen vacancy in the oxide semiconductor layer 10 functions as a donor.

The length of the oxide semiconductor layer 10 in the first direction is, for example, equal to or more than nm and equal to or less than 200 nm.

The gate electrode 12 faces the oxide semiconductor layer 10. The gate electrode 12 is provided so that the position coordinates of the gate electrode 12 in the first direction are a value between the position coordinates of the lower electrode 15 and the position coordinates of the upper electrode 17 in the first direction.

As shown in FIG. 9, the gate electrode 12 surrounds the oxide semiconductor layer 10. The gate electrode 12 is provided around the oxide semiconductor layer 10.

The gate electrode 12 is, for example, a metal, a metal compound, or a semiconductor. The gate electrode 12 contains, for example, tungsten (W). The gate electrode 12 is, for example, a tungsten layer.

The length of the gate electrode 12 in the first direction is, for example, equal to or more than 20 nm and equal to or less than 100 nm.

The gate insulating layer 14 is provided between the gate electrode 12 and the oxide semiconductor layer 10. The gate insulating layer 14 is provided so as to surround the oxide semiconductor layer 10. The gate insulating layer 14 is in contact with the oxide semiconductor layer 10.

The gate insulating layer 14 is, for example, an oxide, a nitride, or an oxynitride. The gate insulating layer 14 contains, for example, silicon oxide, silicon nitride, silicon oxynitride, aluminum oxide, hafnium oxide, or zirconium oxide. The gate insulating layer 14 includes, for example, a silicon oxide film, a silicon nitride film, a silicon oxynitride film, an aluminum oxide film, a hafnium oxide film, or a zirconium oxide film. The gate insulating layer 14 includes, for example, a stacked film of the films exemplified above. The thickness of the gate insulating layer 14 is, for example, equal to or more than 2 nm and equal to or less than 10 nm.

The p-type semiconductor layer 20 is provided between the lower electrode 15 and the upper electrode 17. The p-type semiconductor layer 20 faces the oxide semiconductor layer 10.

As shown in FIG. 9, the p-type semiconductor layer 20 is surrounded by the oxide semiconductor layer 10. The oxide semiconductor layer 10 is provided around the p-type semiconductor layer 20. The p-type semiconductor layer 20 is in contact with the oxide semiconductor layer 10. The oxide semiconductor layer 10 is provided between the gate electrode 12 and the p-type semiconductor layer 20.

The p-type semiconductor layer 20 is separated from the gate electrode 12, the lower electrode 15, and the upper electrode 17. The p-type semiconductor layer 20 is separated from all electrodes including the gate electrode 12, the lower electrode 15, and the upper electrode 17. The p-type semiconductor layer 20 is electrically floating.

The conduction band bottom energy Ec2 of the p-type semiconductor layer 20 is larger than the conduction band bottom energy Ec1 of the oxide semiconductor layer 10, for example. In addition, the conduction band bottom energy Ec1 of the oxide semiconductor layer 10 is larger than the valence band top energy Ev2 of the p-type semiconductor layer 20, for example. In addition, the valence band top energy Ev2 of the p-type semiconductor layer 20 is larger than the valence band top energy Ev1 of the oxide semiconductor layer 10, for example.

In other words, the electron affinity EA2 of the p-type semiconductor layer 20 is smaller than the electron affinity EA1 of the oxide semiconductor layer 10, for example. In addition, the electron affinity EA1 of the oxide semiconductor layer 10 is smaller than the ionization energy IE2 of the p-type semiconductor layer 20, for example. In addition, the ionization energy IE2 of the p-type semiconductor layer 20 is smaller than the ionization energy IE1 of the oxide semiconductor layer 10, for example.

The difference ΔEc between the conduction band bottom energy Ec2 of the p-type semiconductor layer 20 and the conduction band bottom energy Ec1 of the oxide semiconductor layer 10 is, for example, equal to or more than 0.25 eV. In addition, the difference ΔEx between the conduction band bottom energy Ec1 of the oxide semiconductor layer 10 and the valence band top energy Ev2 of the p-type semiconductor layer 20 is, for example, equal to or more than 0.25 eV. In addition, the difference ΔEv between the valence band top energy Ev2 of the p-type semiconductor layer 20 and the valence band top energy Ev1 of the oxide semiconductor layer 10 is, for example, equal to or more than 0.25 eV.

The p-type semiconductor layer 20 is p-type. The p-type semiconductor layer 20 is a p-type semiconductor.

The p-type semiconductor layer 20 contains, for example, silicon (Si) or germanium (Ge). The p-type semiconductor layer 20 is, for example, a silicon layer, a germanium layer, or a silicon germanide layer.

The p-type semiconductor layer 20 contains, for example, a compound semiconductor. The p-type semiconductor layer 20 contains, for example, aluminum phosphide, aluminum arsenide, aluminum antimonide, gallium phosphide, gallium arsenide, zinc sulfide, zinc selenide, or gallium nitride. The p-type semiconductor layer 20 is, for example, an aluminum phosphide layer, an aluminum arsenide layer, an aluminum antimonide layer, a gallium phosphide layer, a gallium arsenide layer, a zinc sulfide layer, a zinc selenide layer, or a gallium nitride layer.

The p-type semiconductor layer 20 contains p-type impurities. When the p-type semiconductor layer 20 is a silicon layer, the p-type semiconductor layer 20 contains, for example, boron (B) as a p-type impurity.

The p-type impurity concentration in the p-type semiconductor layer 20 is, for example, equal to or more than $1\times10^{18}$ atoms/cm$^3$ and less than $8\times10^{19}$ atoms/cm$^3$.

A p-type semiconductor region having a high oxygen concentration may be present near the interface between the p-type semiconductor layer 20 and the oxide semiconductor layer 10.

The core insulating layer 28 is provided between the lower electrode 15 and the upper electrode 17. The core insulating layer 28 is provided between the lower isolation insulating layer 30 and the upper isolation insulating layer 32.

As shown in FIG. 9, the core insulating layer 28 is surrounded by the p-type semiconductor layer 20. The p-type semiconductor layer 20 is provided around the core insulating layer 28. The core insulating layer 28 is in contact with, for example, the p-type semiconductor layer 20.

The core insulating layer 28 is, for example, an oxide, a nitride, or an oxynitride. The core insulating layer 28 contains, for example, silicon oxide, silicon nitride, or silicon oxynitride. The core insulating layer 28 is, for example, a silicon oxide layer, a silicon nitride layer, or a silicon oxynitride layer.

The lower isolation insulating layer 30 is provided between the lower electrode 15 and the p-type semiconductor layer 20. The lower isolation insulating layer 30 is in contact with, for example, the lower electrode 15 and the p-type semiconductor layer 20.

The lower isolation insulating layer 30 is, for example, an oxide, a nitride, or an oxynitride. The lower isolation insulating layer 30 contains, for example, silicon oxide, silicon nitride, or silicon oxynitride. The lower isolation insulating layer 30 is, for example, a silicon oxide layer, a silicon nitride layer, or a silicon oxynitride layer.

The upper isolation insulating layer 32 is provided between the upper electrode 17 and the p-type semiconductor layer 20. The upper isolation insulating layer 32 is in contact with, for example, the upper electrode 17 and the p-type semiconductor layer 20.

The upper isolation insulating layer 32 is, for example, an oxide, a nitride, or an oxynitride. The upper isolation insulating layer 32 contains, for example, silicon oxide, silicon nitride, or silicon oxynitride. The upper isolation insulating layer 32 is, for example, a silicon oxide layer, a silicon nitride layer, or a silicon oxynitride layer.

The lower insulating layer 24 is provided on the lower electrode 15. The lower insulating layer 24 is provided between the gate electrode 12 and the lower electrode 15. The lower insulating layer 24 surrounds the oxide semiconductor layer 10. For example, the lower insulating layer 24 surrounds the gate insulating layer 14. For example, the gate insulating layer 14 is provided between the lower insulating layer 24 and the oxide semiconductor layer 10.

The lower insulating layer 24 is, for example, an oxide, a nitride, or an oxynitride. The lower insulating layer 24 contains, for example, silicon oxide, silicon nitride, or silicon oxynitride. The lower insulating layer 24 is, for example, a silicon oxide layer, a silicon nitride layer, or a silicon oxynitride layer.

The upper insulating layer 26 is provided on the gate electrode 12. The upper insulating layer 26 is provided between the gate electrode 12 and the upper electrode 17.

The upper insulating layer 26 surrounds the oxide semiconductor layer 10. For example, the upper insulating layer 26 surrounds the gate insulating layer 14. For example, the gate insulating layer 14 is provided between the upper insulating layer 26 and the oxide semiconductor layer 10.

The upper insulating layer 26 is, for example, an oxide, a nitride, or an oxynitride. The upper insulating layer 26 contains, for example, silicon oxide, silicon nitride, or silicon oxynitride. The upper insulating layer 26 is, for example, a silicon oxide layer, a silicon nitride layer, or a silicon oxynitride layer.

In the transistor 200 according to the second embodiment, since the p-type semiconductor layer 20 is provided, the threshold voltage is increased by the same function as in the transistor 100 according to the first embodiment. As a result, for example, even when the electron concentration in the oxide semiconductor layer 10 is increased to increase the on-current, it is possible to suppress the degradation of the cutoff characteristics of the transistor 200.

From the viewpoint of increasing the threshold voltage of the transistor 200, it is preferable that the difference $\Delta Ex$ between the conduction band bottom energy Ec1 of the oxide semiconductor layer 10 and the valence band top energy Ev2 of the p-type semiconductor layer 20 is equal to or more than 0.25 eV.

From the viewpoint of securing a barrier against electrons between the oxide semiconductor layer 10 and the p-type semiconductor layer 20, it is preferable that the difference $\Delta Ec$ between the conduction band bottom energy Ec2 of the p-type semiconductor layer 20 and the conduction band bottom energy Ec1 of the oxide semiconductor layer 10 is equal to or more than 0.25 eV.

From the viewpoint of securing a barrier against holes between the oxide semiconductor layer 10 and the p-type semiconductor layer 20, it is preferable that the difference $\Delta Ev$ between the valence band top energy Ev2 of the p-type semiconductor layer 20 and the valence band top energy Ev1 of the oxide semiconductor layer 10 is equal to or more than 0.25 eV.

From the viewpoint of increasing the threshold voltage of the transistor 200, the p-type impurity concentration in the p-type semiconductor layer 20 is preferably equal to or more than $1\times10^{18}$ atoms/cm$^3$, more preferably equal to or more than $5\times10^{18}$ atoms/cm$^3$, and even more preferably equal to or more than $1\times10^{19}$ atoms/cm$^3$.

From the viewpoint of suppressing a decrease in threshold voltage due to band-to-band tunneling between the oxide semiconductor layer 10 and the p-type semiconductor layer 20, it is preferable that the p-type impurity concentration in the p-type semiconductor layer 20 is less than $8\times10^{19}$ atoms/cm$^3$.

First Modification Example

A semiconductor device of a first modification example of the second embodiment is different from the semiconductor device according to the second embodiment in that the length of the p-type semiconductor layer in the first direction connecting the first electrode and the second electrode to each other is shorter than the length of the gate electrode in the first direction.

Figure 10:
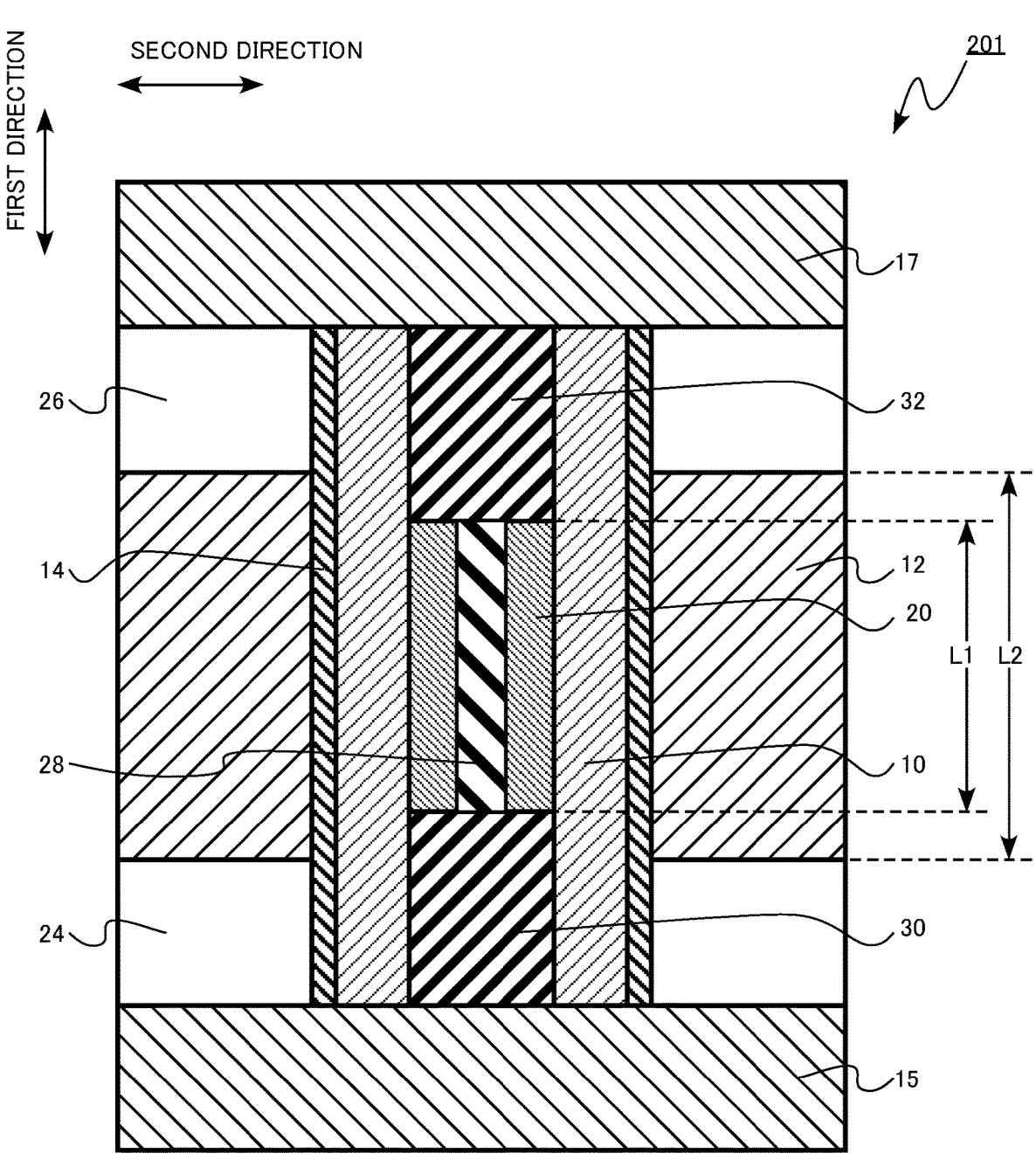
FIG. 10 is a schematic cross-sectional view of a semiconductor device of a first modification example of the second embodiment.

FIG. 10 is a schematic cross-sectional view of the semiconductor device of the first modification example of the second embodiment. FIG. 10 is a diagram corresponding to FIG. 8 of the second embodiment.

The semiconductor device of the first modification example is a transistor 201.

The length (L1 in FIG. 10) of the p-type semiconductor layer 20 in the first direction is shorter than the length (L2 in FIG. 10) of the gate electrode 12 in the first direction.

Compared with the transistor 200 according to the second embodiment, the transistor 201 of the first modification example has a shorter effective channel length due to the shorter length of the p-type semiconductor layer 20. Therefore, the on-resistance is reduced and the on-current is increased compared with the transistor 200 according to the second embodiment.

Second Modification Example

A semiconductor device of a second modification example of the second embodiment is different from the semiconductor device according to the second embodiment in that the third insulating layer is not provided.

Figure 11:
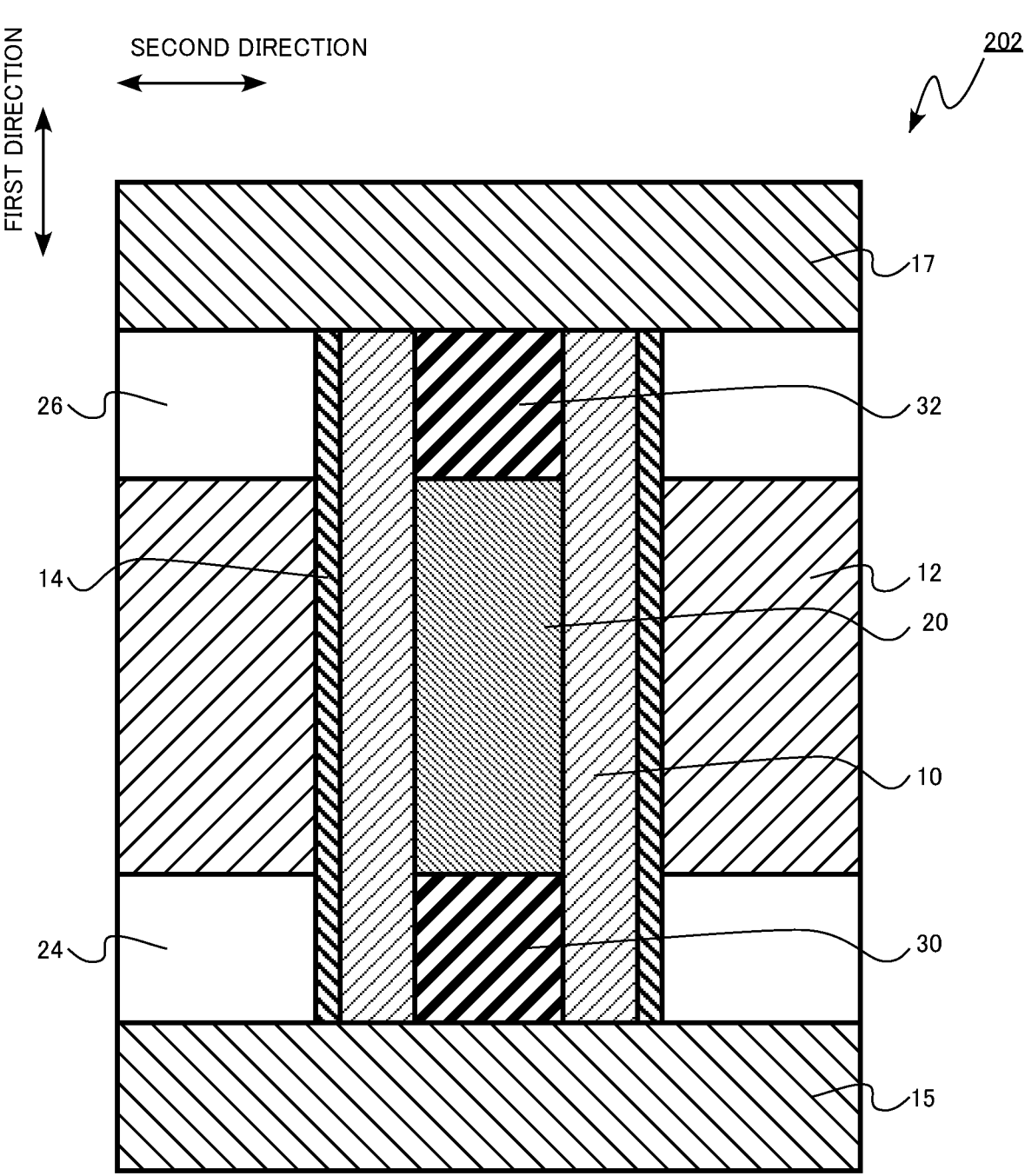
FIG. 11 is a schematic cross-sectional view of a semiconductor device of a second modification example of the second embodiment.

FIG. 11 is a schematic cross-sectional view of the semiconductor device of the second modification example of the second embodiment. FIG. 11 is a diagram corresponding to FIG. 8 of the second embodiment.

The semiconductor device of the second modification example is a transistor 202. The transistor 202 does not include the core insulating layer 28.

Third Modification Example

A semiconductor device of a third modification example of the second embodiment is different from the semiconductor device according to the second embodiment in that the first insulating layer, the second insulating layer, and the third insulating layer are not provided.

Figure 12:
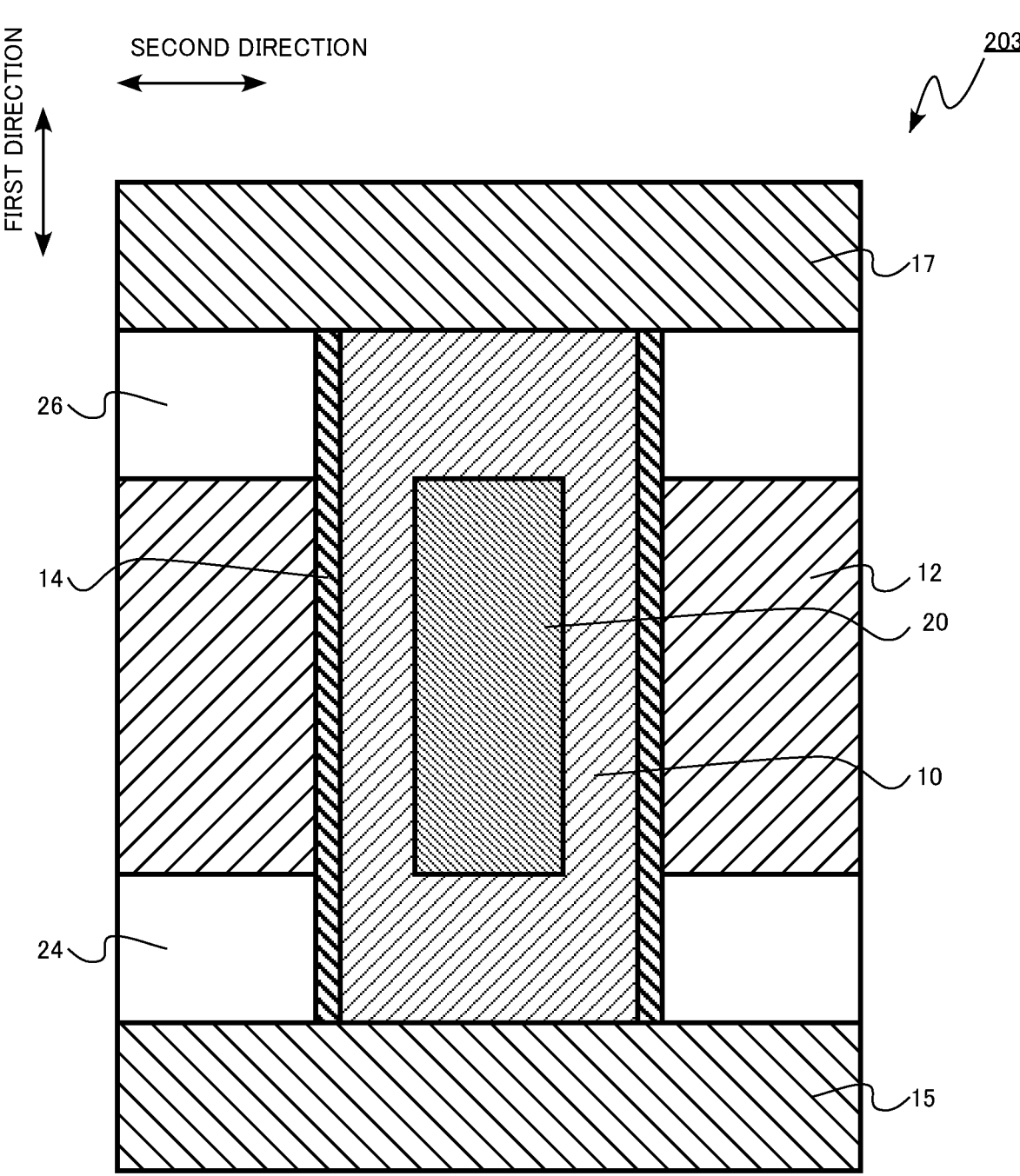
FIG. 12 is a schematic cross-sectional view of a semiconductor device of a third modification example of the second embodiment.

FIG. 12 is a schematic cross-sectional view of the semiconductor device of the third modification example of the second embodiment. FIG. 12 is a diagram corresponding to FIG. 8 of the second embodiment.

The semiconductor device of the third modification example is a transistor 203. The transistor 203 does not include the lower isolation insulating layer 30, the upper isolation insulating layer 32, and the core insulating layer 28.

As described above, according to the second embodiment and its modification examples, since the threshold voltage is increased, it is possible to realize an oxide semiconductor transistor having excellent characteristics.

Third Embodiment

A semiconductor memory device according to a third embodiment includes the semiconductor device according to the second embodiment and a capacitor electrically connected to the first electrode or the second electrode.

The semiconductor memory device according to the third embodiment is a semiconductor memory 300. The semiconductor memory device according to the third embodiment is a DRAM. In the semiconductor memory 300, the transistor 200 according to the second embodiment is used as a switching transistor of a memory cell of a DRAM.

Hereinafter, the description of a part of the content overlapping the first and second embodiments may be omitted.

Figure 13:
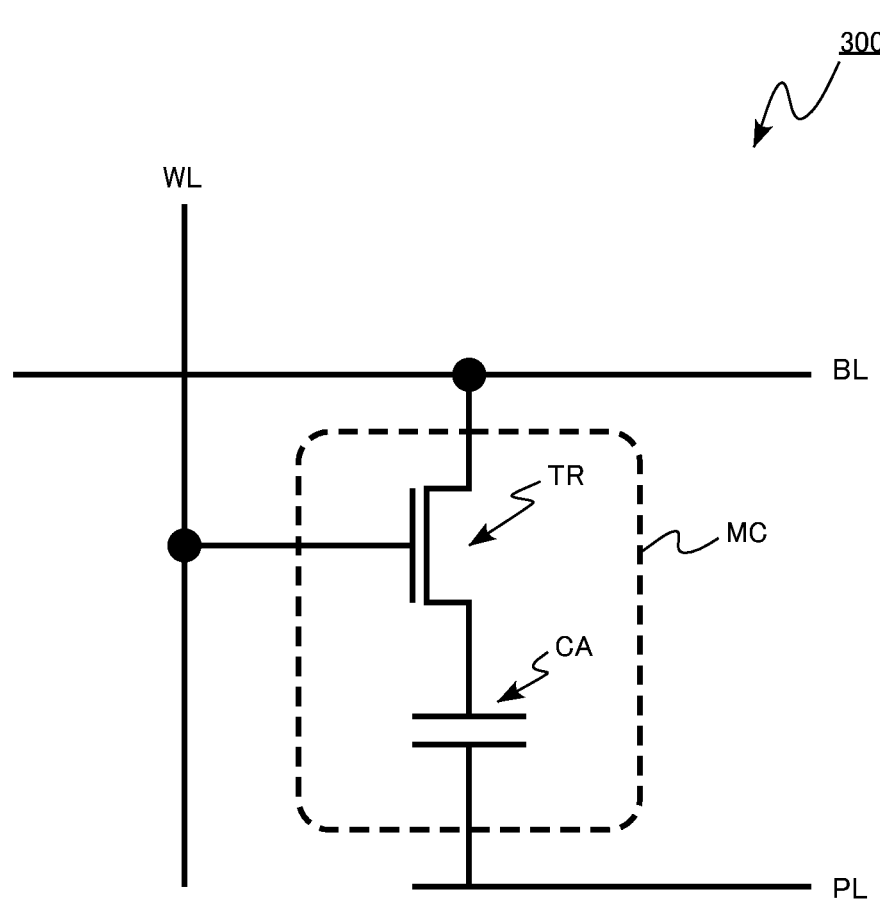
FIG. 13 is an equivalent circuit diagram of a semiconductor memory device according to a third embodiment.

FIG. 13 is an equivalent circuit diagram of the semiconductor memory device according to the third embodiment. FIG. 13 illustrates a case where one memory cell MC is provided. However, for example, a plurality of memory cells MC may be provided in an array.

The semiconductor memory 300 includes the memory cell MC, a word line WL, a bit line BL, and a plate line PL. The memory cell MC includes a switching transistor TR and a capacitor CA. In FIG. 13, a region surrounded by the broken line is the memory cell MC.

The word line WL is electrically connected to the gate electrode of the switching transistor TR. The bit line BL is electrically connected to one of the source electrode and the drain electrode of the switching transistor TR. One electrode of the capacitor CA is electrically connected to the other one of the source electrode and the drain electrode of the switching transistor TR. The other electrode of the capacitor CA is connected to the plate line PL.

The memory cell MC stores data by storing charges in the capacitor CA. Data is written and read by turning on the switching transistor TR.

For example, data is written into the memory cell MC by turning on the switching transistor TR in a state in which a desired voltage is applied to the bit line BL.

In addition, for example, a voltage change in the bit line BL according to the amount of charge stored in the capacitor is detected by turning on the switching transistor TR, thereby reading the data of the memory cell MC.

Figure 14:
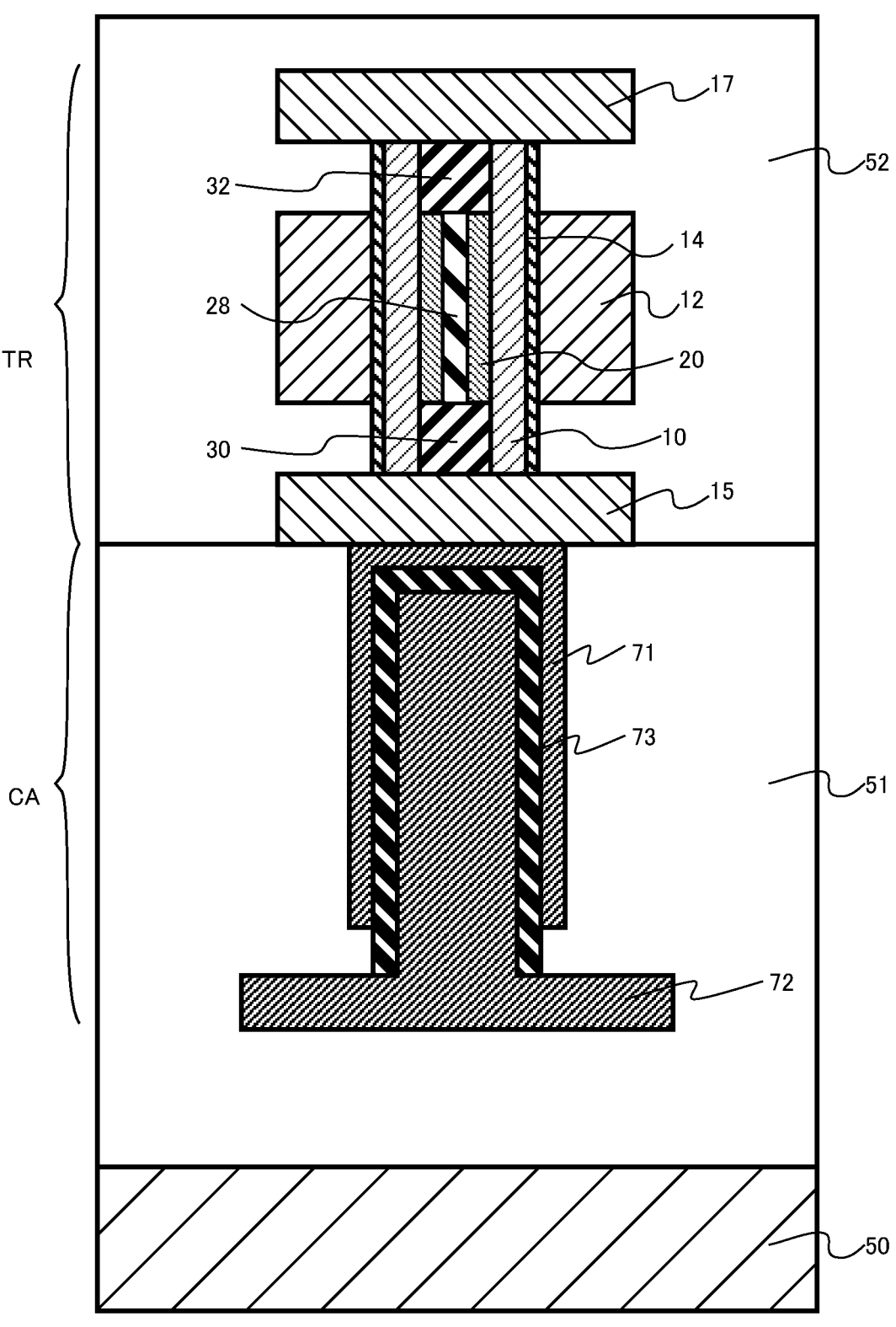
FIG. 14 is a schematic cross-sectional view of the semiconductor memory device according to the third embodiment.

FIG. 14 is a schematic cross-sectional view of the semiconductor memory device according to the third embodiment. FIG. 14 shows a cross section of the memory cell MC of the semiconductor memory 300.

The semiconductor memory 300 includes a silicon substrate 50, the switching transistor TR, the capacitor CA, a lower interlayer insulating layer 51, and an upper interlayer insulating layer 52.

The switching transistor TR includes an oxide semiconductor layer 10, a gate electrode 12, a gate insulating layer 14, a lower electrode 15, an upper electrode 17, a p-type semiconductor layer 20, a core insulating layer 28, a lower isolation insulating layer 30, and an upper isolation insulating layer 32.

The lower electrode 15 is an example of the first electrode. The upper electrode 17 is an example of the second electrode. The core insulating layer 28 is an example of the third insulating layer. The lower isolation insulating layer 30 is an example of the first insulating layer. The upper isolation insulating layer 32 is an example of the second insulating layer.

The switching transistor TR has a structure similar to that of the transistor 200 according to the second embodiment.

The capacitor CA is provided between the silicon substrate 50 and the switching transistor TR. The capacitor CA is provided between the silicon substrate 50 and the lower electrode 15. The capacitor CA is electrically connected to the lower electrode 15.

The capacitor CA includes a cell electrode 71, a plate electrode 72, and a capacitor insulating film 73. The cell electrode 71 is electrically connected to the lower electrode 15. The cell electrode 71 is in contact with, for example, the lower electrode 15.

The cell electrode 71 and the plate electrode 72 are, for example, titanium nitride. The capacitor insulating film 73 has, for example, a stacked structure of zirconium oxide, aluminum oxide, and zirconium oxide.

The gate electrode 12 is electrically connected to, for example, the word line WL (not shown). The upper electrode 17 is electrically connected to, for example, the bit line BL (not shown). The plate electrode 72 is connected to, for example, the plate line PL (not shown).

In the semiconductor memory 300, an oxide semiconductor transistor having a high threshold voltage is applied as the switching transistor TR. Therefore, for example, a DRAM having an excellent charge storage characteristic is realized.

As described above, according to the third embodiment, it is possible to realize a semiconductor memory including an oxide semiconductor transistor with a high threshold voltage and having improved memory characteristics.

In the second embodiment, a transistor in which the gate electrode 12 is provided so as to surround the oxide semiconductor layer 10 has been described as an example. However, the transistor of embodiments may be a transistor in which a gate electrode does not surround an oxide semiconductor layer. For example, the transistor of embodiments may be a transistor in which an oxide semiconductor layer is interposed between two gate electrodes.

In the third embodiment, a semiconductor memory to which the transistor according to the second embodiment is applied has been described as an example. However, the semiconductor memory of embodiments may be a semiconductor memory to which the transistors of the first to third modification examples of the second embodiment are applied. In addition, the semiconductor memory of embodiments may be a semiconductor memory to which the transistor according to the first embodiment or the transistor of the first or second modification example of the first embodiment is applied.

In the third embodiment, a semiconductor memory in which a cell electrode is electrically connected to the lower electrode 15 has been described as an example. However, the semiconductor memory of embodiments may be a semiconductor memory in which a cell electrode is electrically connected to the upper electrode 17.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode;
a second electrode;
an oxide semiconductor layer provided between the first electrode and the second electrode, and the oxide semiconductor layer being in direct contact with the first electrode and the second electrode;
a gate electrode facing the oxide semiconductor layer;
a gate insulating layer provided between the gate electrode and the oxide semiconductor layer;
a p-type semiconductor layer surrounded by the oxide semiconductor layer in a cross section perpendicular to a first direction connecting the first electrode and the second electrode to each other, the p-type semiconductor layer being in contact with the oxide semiconductor layer, and separated from the gate electrode, the first electrode, and the second electrode;
a first insulating layer provided between the first electrode and the p-type semiconductor layer, and the first insulating layer being surrounded by the oxide semiconductor layer in a cross section perpendicular to the first direction; and
a second insulating layer provided between the second electrode and the p-type semiconductor layer, and the second insulating layer being surrounded by the oxide semiconductor layer in a cross section perpendicular to the first direction.

2. The semiconductor device according to claim 1, wherein the oxide semiconductor layer is n-type.

3. The semiconductor device according to claim 1, wherein a conduction band bottom energy of the p-type semiconductor layer is larger than a conduction band bottom energy of the oxide semiconductor layer, the conduction band bottom energy of the oxide semiconductor layer is larger than a valence band top energy of the p-type semiconductor layer, and the valence band top energy of the p-type semiconductor layer is larger than a valence band top energy of the oxide semiconductor layer.

4. The semiconductor device according to claim 3, wherein a difference between the conduction band bottom energy of the p-type semiconductor layer and the conduction band bottom energy of the oxide semiconductor layer is equal to or more than 0.25 eV.

5. The semiconductor device according to claim 3, wherein a difference between the conduction band bottom energy of the oxide semiconductor layer and the valence band top energy of the p-type semiconductor layer is equal to or more than 0.25 eV.

6. The semiconductor device according to claim 1, wherein the p-type semiconductor layer is electrically floating.

7. The semiconductor device according to claim 1, wherein the oxide semiconductor layer contains zinc (Zn), oxygen (O), and at least one element selected from a group consisting of indium (In), gallium (Ga), silicon (Si), aluminum (Al), and tin (Sn).

8. The semiconductor device according to claim 1, wherein the p-type semiconductor layer contains silicon (Si).

9. The semiconductor device according to claim 1, wherein a p-type impurity concentration in the p-type semiconductor layer is equal to or more than $1 \times 10^{18}$ atoms/cm3 and less than $8 \times 10^{19}$ atoms/cm3.

10. The semiconductor device according to claim 1, wherein the gate electrode surrounds the oxide semiconductor layer.

11. The semiconductor device according to claim 1, wherein a length of the p-type semiconductor layer in the first direction connecting the first electrode and the second electrode to each other is shorter than a length of the gate electrode in the first direction.

12. The semiconductor device according to claim 1, further comprising:
   a third insulating layer surrounded by the p-type semiconductor layer.

13. A semiconductor memory device, comprising:
   the semiconductor device according to claim 1; and
   a capacitor electrically connected to the first electrode or the second electrode.

* * * * *